(12) United States Patent
Hatase et al.

(10) Patent No.: US 12,484,146 B2
(45) Date of Patent: Nov. 25, 2025

(54) STRUCTURE BODY AND METHOD OF MANUFACTURING THE SAME

(71) Applicant: Murata Manufacturing Co., Ltd., Kyoto-fu (JP)

(72) Inventors: Minoru Hatase, Nagaokakyo (JP); Yoshihito Otsubo, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 547 days.

(21) Appl. No.: 18/153,596

(22) Filed: Jan. 12, 2023

(65) Prior Publication Data
US 2023/0171885 A1 Jun. 1, 2023

Related U.S. Application Data

(63) Continuation of application No. PCT/JP2021/025885, filed on Jul. 9, 2021.

(30) Foreign Application Priority Data

Aug. 3, 2020 (JP) .................. 2020-131858

(51) Int. Cl.
*H05K 1/02* (2006.01)
*H05K 1/03* (2006.01)
*H05K 3/46* (2006.01)

(52) U.S. Cl.
CPC ......... *H05K 1/0298* (2013.01); *H05K 1/0306* (2013.01); *H05K 3/46* (2013.01)

(58) Field of Classification Search
CPC .............. H05K 1/0298; H05K 1/0306; H05K 2203/308; H05K 2203/1327; H05K 3/284; H05K 3/4061; H05K 3/46; H05K 3/4629
See application file for complete search history.

(56) References Cited

U.S. PATENT DOCUMENTS 9,788,416 B2 * 10/2017 Jen ................... H01L 21/02008
2010/0220448 A1 * 9/2010 Nomura ................. H01L 25/16
361/746
2011/0024899 A1 * 2/2011 Masumoto ........... H01L 25/105
257/E21.705

FOREIGN PATENT DOCUMENTS

| JP | H03-112191 A | 5/1991 |
|---|---|---|
| JP | 2681327 B2 | 11/1997 |
| JP | 4329884 B2 | 9/2009 |

OTHER PUBLICATIONS

International Search Report for PCT/JP2021/025885 dated Oct. 5, 2021.

* cited by examiner

*Primary Examiner* — Timothy J Thompson
*Assistant Examiner* — Rhadames Alonzo Miller
(74) *Attorney, Agent, or Firm* — McDonald Hopkins LLC

(57) ABSTRACT

A structure body includes a ceramic substrate including a first surface, a first conductor pattern arranged on the first surface, and a first columnar conductor connected to the first conductor pattern and extending in a direction of thickness in an orientation away from the ceramic substrate. The first columnar conductor is provided with a recess in an end surface on a side close to the ceramic substrate and the first surface is provided with a raised portion in conformity with the recess in a region where the first columnar conductor is superimposed.

20 Claims, 14 Drawing Sheets

STRUCTURE BODY AND METHOD OF MANUFACTURING THE SAME

CROSS REFERENCE TO RELATED APPLICATION

This is a continuation of International Application No. PCT/JP2021/025885 filed on Jul. 9, 2021 which claims priority from Japanese Patent Application No. 2020-131858 filed on Aug. 3, 2020. The contents of these applications are incorporated herein by reference in their entireties.

BACKGROUND OF THE DISCLOSURE

Field of the Disclosure

The present disclosure relates to a structure body and a method of manufacturing the same.

Description of the Related Art

Japanese Patent No. 2681327 (PTL 1) describes a method of manufacturing a circuit substrate with a bump including a ceramic substrate and a bump provided on a surface of the ceramic substrate. According to PTL 1, this bump is obtained by providing a through hole in an unsintered sheet which is not sintered at a sintering temperature of a green sheet, filling the through hole with a conductor, and removing the unsintered sheet after heating.

PTL 1: Japanese Patent No. 2681327

BRIEF SUMMARY OF THE DISCLOSURE

According to PTL 1, an electrode called a bump does not deform during thermocompression bonding and heating of a green sheet, and hence there is no variation in shape, thickness, and pitch. An object called a "bump" in PTL 1 is a columnar electrode, and called a columnar conductor below.

In an attempt to form such columnar conductors equal in height without grinding works following formation, a conductive paste that shrinks less during firing should be employed as a conductive paste for filling in a through hole for formation of the columnar conductor. In this case, since the conductive paste shrinks less, a bonding surface between a ceramic substrate and a columnar conductor is flat and it is difficult to obtain high bonding strength between the columnar conductor and the ceramic substrate. Therefore, when large force is applied to the columnar conductor in a resin sealing process which is to be performed after formation of the columnar conductor, the columnar conductor may disadvantageously come off from the ceramic substrate.

A possible benefit of the present disclosure is to improve bonding strength between a columnar conductor and a ceramic substrate.

In order to achieve the possible benefit, a structure body based on the present disclosure includes a ceramic substrate including a first surface, a first conductor pattern arranged on the first surface, and a first columnar conductor connected to the first conductor pattern and extending in a direction of thickness in an orientation away from the ceramic substrate. The first columnar conductor is provided with a recess in an end surface on a side close to the ceramic substrate. The first surface is provided with a raised portion in conformity with the recess in a region where the first columnar conductor is superimposed.

According to the present disclosure, the presence of the recess in the end surface of the first columnar conductor leads to increase in area of bonding. Therefore, bonding strength between the first columnar conductor and the ceramic substrate is enhanced.

DETAILED DESCRIPTION OF THE DISCLOSURE

Figure 1:
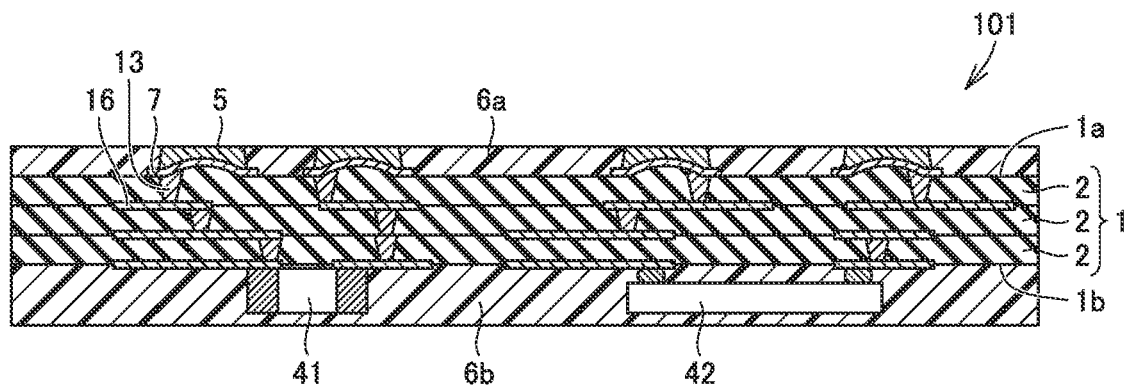
FIG. 1 is a cross-sectional view of a structure body in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
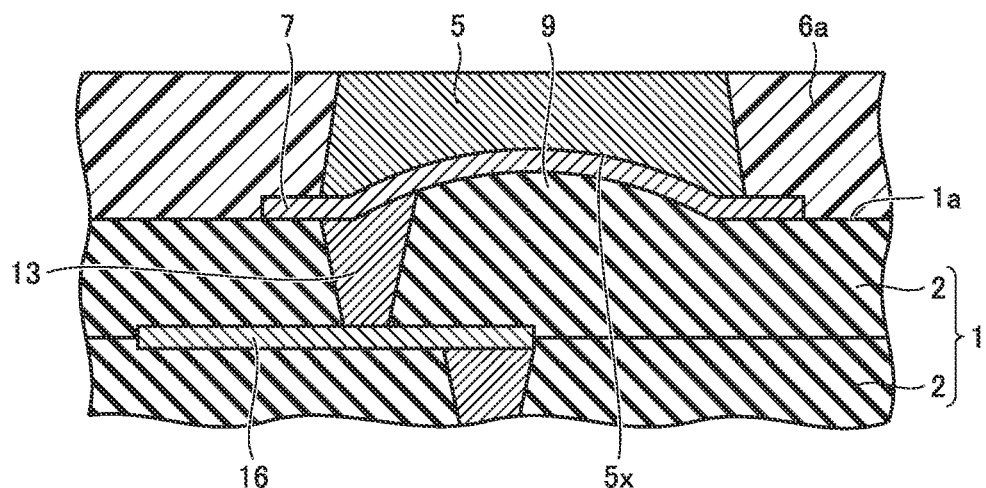
FIG. 2 is a partially enlarged view of FIG. 1.

A structure body in a first embodiment based on the present disclosure will be described with reference to FIGS. 1 to 2. FIG. 1 shows a cross-sectional view of a structure body 101 in the present embodiment.

Structure body 101 includes a ceramic substrate 1 including a first surface 1a, a first conductor pattern 7 arranged on first surface 1a, and a first columnar conductor 5 connected to first conductor pattern 7 and extending in a direction of thickness in an orientation away from ceramic substrate 1. Ceramic substrate 1 includes a second surface 1b as a surface opposite to first surface 1a. Ceramic substrate 1 includes a plurality of layered insulating layers 2. FIG. 2 shows first columnar conductor 5 and the vicinity thereof in FIG. 1 as being enlarged. First columnar conductor 5 is provided with a recess 5x in an end surface on a side close to ceramic substrate 1. First surface 1a is provided with a raised portion 9 in conformity with recess 5x in a region where first columnar conductor 5 is superimposed.

Some kind of a conductor film (not shown) may be provided on a lower surface of first columnar conductor 5. Even when at least one conductor film composed of a material different from a material for other portions of first columnar conductor 5 is provided on the lower surface of first columnar conductor 5, the entirety including also the conductor film is regarded as first columnar conductor 5.

In the inside of ceramic substrate 1, a conductor pattern 16 and a conductor via 13 are arranged. Conductor pattern 16 is arranged at an interface between insulating layers 2. Conductor via 13 passes through insulating layer 2 in the direction of thickness. Conductor via 13 is arranged also under first conductor pattern 7. Conductor via 13 at this position electrically connects first conductor pattern 7 and conductor pattern 16 to each other.

Though an example in which conductor via 13 is arranged below first columnar conductor 5 is shown, it is not essential that conductor via 13 is located at this position. For example, first conductor pattern 7 may be connected to a lower side of first columnar conductor 5, and conductor via 13 may be connected to a lower side of first conductor pattern 7 on an extension of first conductor pattern 7 in a lateral direction. Alternatively, there may be no conductor via 13 connected to first conductor pattern 7.

Components 41 and 42 are mounted on second surface 1b. On first surface 1a, a portion around first columnar conductor 5 is sealed with a sealing resin 6a. An end surface of first columnar conductor 5 on a side distant from ceramic substrate 1 is exposed through sealing resin 6a. Components 41 and 42 on second surface 1b are covered with a sealing resin 6b.

In the present embodiment, first columnar conductor 5 is provided with recess 5x in the end surface on the side close to ceramic substrate 1, and first surface 1a is provided with raised portion 9 in conformity with recess 5x in the region where first columnar conductor 5 is superimposed. Therefore, first conductor pattern 7 is interposed as being curved along this shape. According to such a structure, an area of bonding between first columnar conductor 5 and first conductor pattern 7 and an area of bonding between first conductor pattern 7 and ceramic substrate 1 are both larger. Therefore, bonding strength between first columnar conductor 5 and ceramic substrate 1 is enhanced, and consequently reliability of the structure body improves.

In the present embodiment, structure body 101 includes conductor via 13. Conductor via 13 is connected to first conductor pattern 7 and extends in the direction of thickness in the orientation from first surface 1a toward the inside of ceramic substrate 1. As shown in the present embodiment, when first columnar conductor 5 and conductor via 13 are two-dimensionally viewed, conductor via 13 is preferably arranged to at least partially be superimposed on first columnar conductor 5 at a position displaced from the center of first columnar conductor 5. Thus, as conductor via 13 is located at the position displaced from the center of first columnar conductor 5, possibility of disconnection involved with deformation of first columnar conductor 5 can be lowered.

Since first columnar conductor 5 is connected not only to ceramic substrate 1 but also to conductor via 13 with first conductor pattern 7 being interposed, they can be connected by metal-to-metal bonding and bonding higher in strength than connection between a ceramic layer and a metal can be achieved. With enhanced bonding strength, possibility of break can be lowered.

As shown in the present embodiment, first columnar conductor 5 may be in a tapered shape as decreasing in diameter as a distance from first surface 1a increases. By adopting this construction, a large area of bonding with first surface 1a can be secured and hence bonding strength can be enhanced.

Alternatively, in contrast, first columnar conductor 5 may be in a tapered shape as increasing in diameter as the distance from first surface 1a increases. By adopting this construction, a large area of bonding of first columnar conductor 5 in mount of the structure body on a mother substrate or the like can be secured and hence bonding strength can be enhanced.

Preferably, a shrinkage ratio during firing of a material for first columnar conductor 5 is higher than a shrinkage ratio during firing of a material for ceramic substrate 1. With such relation of magnitude of the shrinkage ratio, recess 5*x* is more reliably provided during firing and an area of bonding can effectively be increased.

Though a construction in which components 41 and 42 are mounted on second surface 1*b* and the components are covered with sealing resin 6*b* is described as structure body 101 in the present embodiment, this is merely by way of example. Components 41 and 42 and sealing resin 6*b* are not essential for the structure body. In the structure body based on the present disclosure, no component may be mounted on second surface 1*b*. In the structure body based on the present disclosure, no component may be mounted on second surface 1*b* and no sealing resin 6*b* may be formed thereon either. A structure body in which a component is mounted on any one surface of a ceramic substrate may also be called a "module".

(Manufacturing Method)

Figure 3:
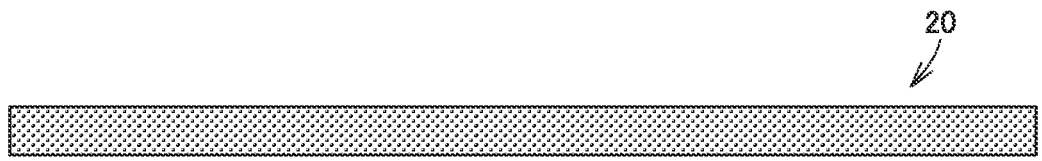
FIG. 3 is an illustrative view of a first step in a method of manufacturing a structure body in the first embodiment based on the present disclosure.
Figure 4:
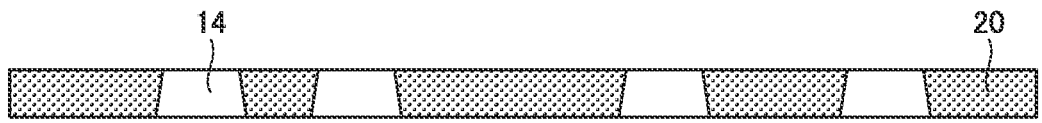
FIG. 4 is an illustrative view of a second step in the method of manufacturing a structure body in the first embodiment based on the present disclosure.
Figure 5:
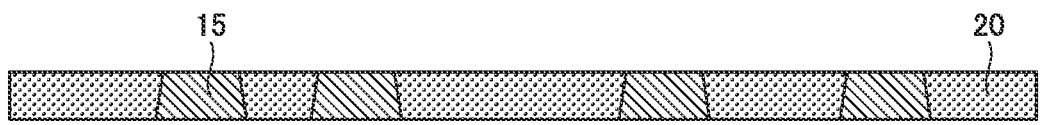
FIG. 5 is an illustrative view of a third step in the method of manufacturing a structure body in the first embodiment based on the present disclosure.

A method of manufacturing a structure body in the present embodiment will be described with reference to FIGS. 3 to 12. Initially, as shown in FIG. 3, a sacrificial sheet 20 is prepared. Sacrificial sheet 20 is a sheet which is not sintered in a temperature range where a ceramic component of a ceramic green sheet is sintered. Then, as shown in FIG. 4, a through hole 14 is provided in sacrificial sheet 20. Through hole 14 can be provided, for example, by laser machining. In an example shown in FIG. 4, through hole 14 is provided by performing laser machining from a lower surface. Furthermore, as shown in FIG. 5, through hole 14 is filled with a conductive paste 15.

Figure 6:
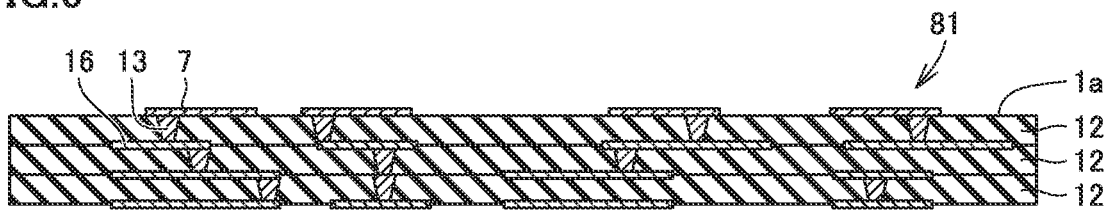
FIG. 6 is an illustrative view of a fourth step in the method of manufacturing a structure body in the first embodiment based on the present disclosure.

As shown in FIG. 6, a first multilayer body 81 which is a multilayer body of ceramic green sheets 12 is prepared. First multilayer body 81 includes first surface 1*a*. First multilayer body 81 contains conductor pattern 16 and conductor via 13 therein. First multilayer body 81 includes first conductor pattern 7 on first surface 1*a*.

Figure 7:
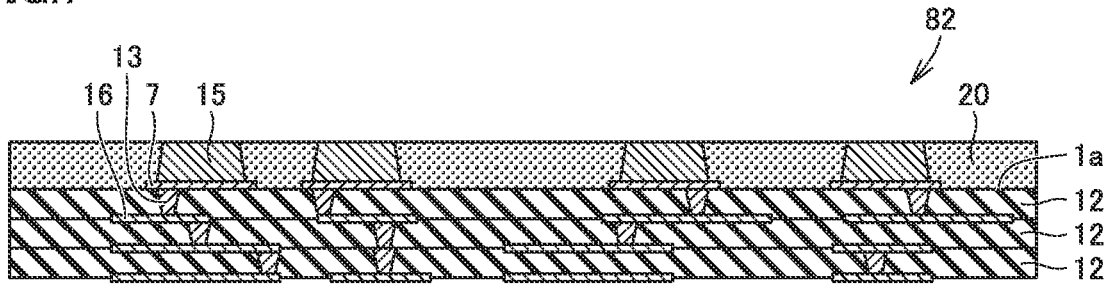
FIG. 7 is an illustrative view of a fifth step in the method of manufacturing a structure body in the first embodiment based on the present disclosure.
Figure 8:
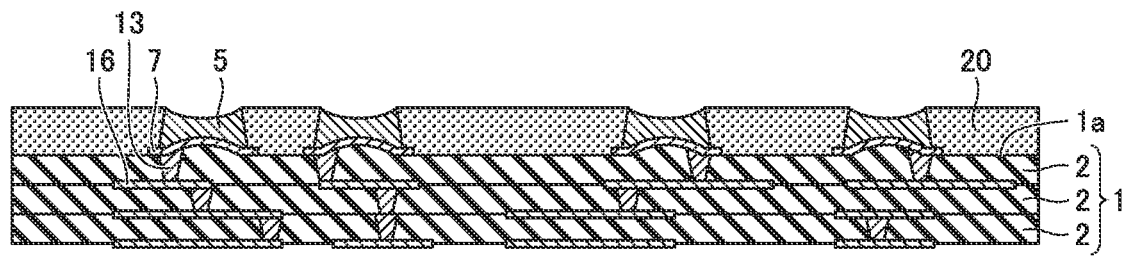
FIG. 8 is an illustrative view of a sixth step in the method of manufacturing a structure body in the first embodiment based on the present disclosure.

As shown in FIG. 7, sacrificial sheet 20 is layered on first surface 1*a* of first multilayer body 81. A second multilayer body 82 is thus obtained. Second multilayer body 82 is fired in this state. Consequently, a state as shown in FIG. 8 is obtained. Through firing, conductive paste 15 filled in through hole 14 shrinks. Individual ceramic green sheet 12 becomes insulating layer 2. Through firing, the multilayer body of ceramic green sheets 12 becomes ceramic substrate 1 as the multilayer body of insulating layers 2. In ceramic substrate 1, the plurality of insulating layers 2 have already been integrated. A portion of conductive paste 15 in contact with sacrificial sheet 20 does not shrink but a central portion of conductive paste 15 shrinks. Therefore, first columnar conductor 5 is in a shape recessed in the central portion of the end surface.

Figure 9:
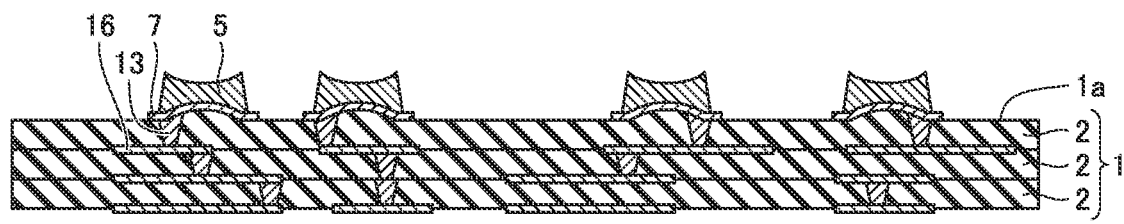
FIG. 9 is an illustrative view of a seventh step in the method of manufacturing a structure body in the first embodiment based on the present disclosure.

Then, unsintered sacrificial sheet 20 is removed. Removal works may be done, for example, by sandblast. Since sacrificial sheet 20 has not been sintered, it is removed and a state as shown in FIG. 9 is obtained.

Figure 10:
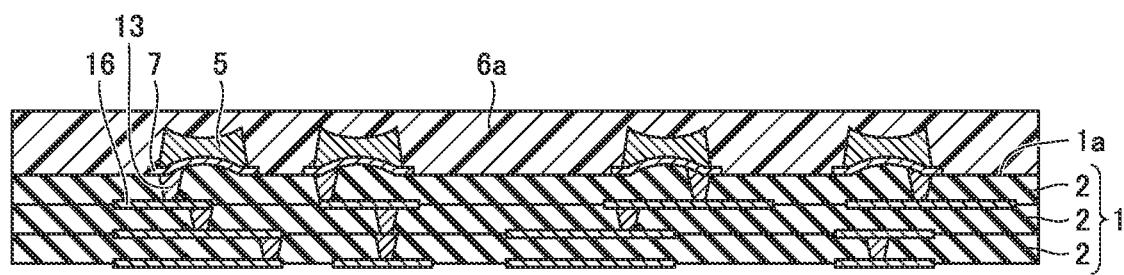
FIG. 10 is an illustrative view of an eighth step in the method of manufacturing a structure body in the first embodiment based on the present disclosure.
Figure 11:
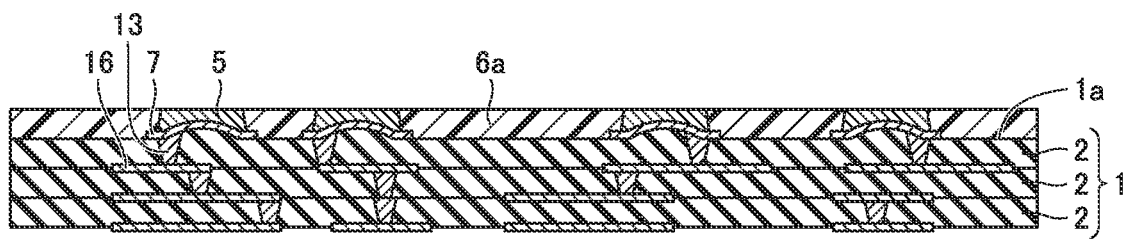
FIG. 11 is an illustrative view of a ninth step in the method of manufacturing a structure body in the first embodiment based on the present disclosure.

As shown in FIG. 10, everything on first surface 1*a* is covered with sealing resin 6*a*. Then, an upper surface is ground. A state shown in FIG. 11 is thus obtained. As a result of grinding, the upper surface of first columnar conductor 5 is exposed through sealing resin 6*a*.

Figure 12:
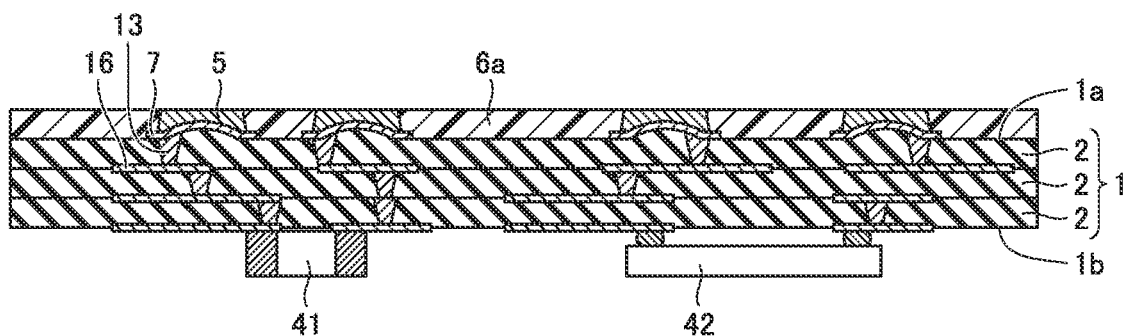
FIG. 12 is an illustrative view of a tenth step in the method of manufacturing a structure body in the first embodiment based on the present disclosure.

As shown in FIG. 12, components 41 and 42 are mounted on second surface 1*b* of ceramic substrate 1. Furthermore, sealing resin 6*b* is arranged to cover second surface 1*b* and components 41 and 42. Structure body 101 shown in FIG. 1 can thus be obtained.

Though sacrificial sheet 20 is layered on first multilayer body 81 in FIG. 7, the order is not limited as such. For example, first multilayer body 81 may be layered on sacrificial sheet 20.

The summary of the method of manufacturing a structure body described above can be expressed as below. The method of manufacturing a structure body includes providing through hole 14 in sacrificial sheet 20 which is not sintered in a temperature range where a ceramic component of a ceramic green sheet is sintered, filling through hole 14 with conductive paste 15, preparing first multilayer body 81 which is a multilayer body of ceramic green sheets, first multilayer body 81 including first surface 1*a*, obtaining second multilayer body 82 by layering sacrificial sheet 20 on first surface 1*a* of first multilayer body 81, firing second multilayer body 82, and removing sacrificial sheet 20 from second multilayer body 82 to leave first columnar conductor 5 generated by firing of conductive paste 15. After firing, first columnar conductor 5 is provided with recess 5*x* in the end surface on the side close to ceramic substrate 1 formed by firing of first multilayer body 81, and first surface 1*a* is provided with raised portion 9 in conformity with recess 5*x* in the region where first columnar conductor 5 is superimposed.

In this manufacturing method, preferably, the shrinkage ratio during firing of conductive paste 15 is higher than the shrinkage ratio during firing of ceramic green sheet 12. With such relation of magnitude of the shrinkage ratio, recess 5*x* is more reliably provided during firing and an area of bonding can effectively be increased.

Second Embodiment

Figure 13:
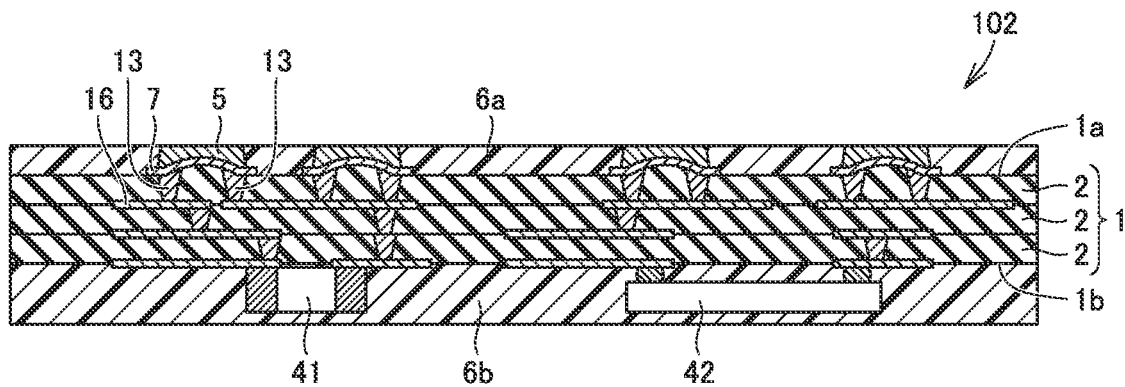
FIG. 13 is a cross-sectional view of a structure body in a second embodiment based on the present disclosure.
Figure 14:
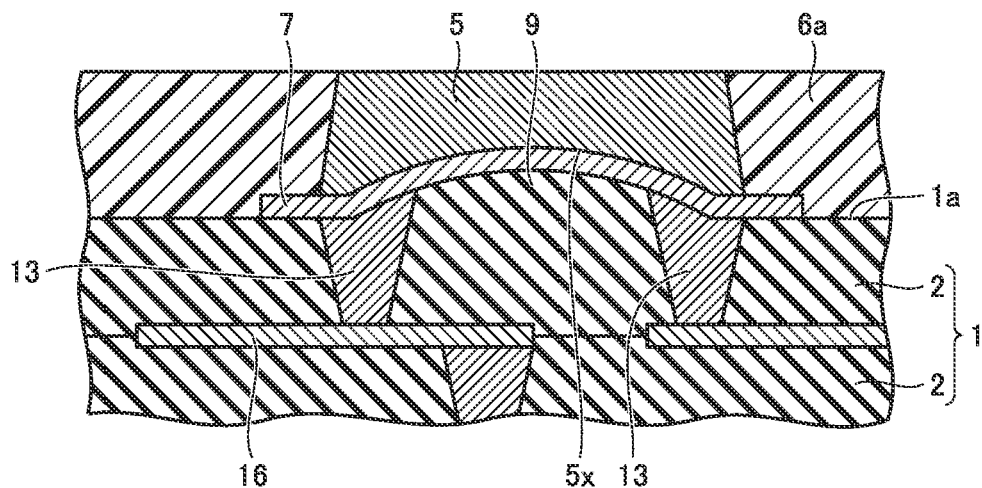
FIG. 14 is a partially enlarged view of FIG. 13.
Figure 15:
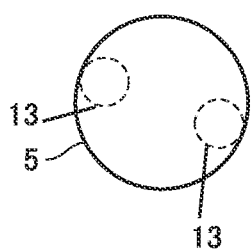
FIG. 15 is a plan view showing positional relation in a first example of a first columnar conductor and a conductor via provided in the structure body in the second embodiment based on the present disclosure.

A structure body in a second embodiment based on the present disclosure will be described with reference to FIGS. 13 to 18. FIG. 13 shows a cross-sectional view of a structure body 102 in the present embodiment. Structure body 102 is similar in basic construction to structure body 101 described in the first embodiment. FIG. 14 shows first columnar conductor 5 and the vicinity thereof as being enlarged. FIG. 15 two-dimensionally shows first columnar conductor 5 and conductor via 13. A circle shown in FIG. 15 represents an outline at a lower end of first columnar conductor 5. FIG. 15 shows conductor via 13 with a dashed line because it is located behind first columnar conductor 5. As shown here, two conductor vias 13 are connected to single first columnar conductor 5.

The construction of structure body 102 can be expressed as below. Structure body 102 includes a plurality of conductor vias 13. The plurality of conductor vias 13 are connected to first conductor pattern 7 and extend in the direction of thickness in the orientation from first surface 1*a* toward the inside of ceramic substrate 1. When viewed two-dimensionally, each of the plurality of conductor vias 13 is arranged to at least partially be superimposed on first columnar conductor 5 at a position displaced from the center of first columnar conductor 5. When attention is paid to any one conductor via 13 and the conductor via is viewed two-dimensionally, this conductor via 13 may include both of a portion superimposed on first columnar conductor 5 and a portion not superimposed thereon.

Figure 16:
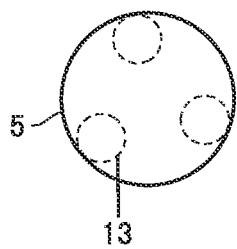
FIG. 16 is a plan view showing positional relation in a second example of the first columnar conductor and the conductor via provided in the structure body in the second embodiment based on the present disclosure.
Figure 17:
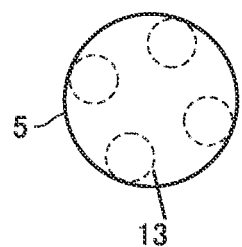
FIG. 17 is a plan view showing positional relation in a third example of the first columnar conductor and the conductor via provided in the structure body in the second embodiment based on the present disclosure.
Figure 18:
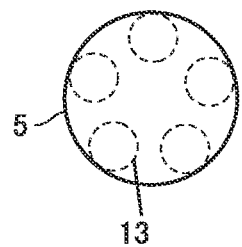
FIG. 18 is a plan view showing positional relation in a fourth example of the first columnar conductor and the conductor via provided in the structure body in the second embodiment based on the present disclosure.

Though an example in which two conductor vias 13 are arranged for single first columnar conductor 5 is shown, at least three conductor vias 13 may be arranged as shown in FIGS. 16, 17, and 18. When a plurality of conductor vias 13 are arranged, preferably, they are arranged to at least partially be superimposed on first columnar conductor 5 at positions displaced from the center of first columnar conductor 5. Therefore, as shown in FIGS. 16, 17, and 18, the plurality of conductor vias 13 are preferably aligned circumferentially when viewed two-dimensionally.

The present embodiment can also obtain an effect as described in the first embodiment. Furthermore, in the present embodiment, the plurality of conductor vias 13 are connected to single first columnar conductor 5 with first conductor pattern 7 being interposed while they are arranged to at least partially be superimposed thereon. Therefore, possibility of disconnection can be lowered. As the plurality of conductor vias 13 are aligned at positions displaced from the center of first columnar conductor 5, a most recessed position of recess 5x in first columnar conductor 5 can be avoided and hence possibility of disconnection can be lowered.

Though all of the plurality of conductor vias 13 are arranged to be accommodated on an inner side of the outline of first columnar conductor 5 in the example shown in FIGS. 15 to 18, conductor via 13 may partially extend beyond the outline of first columnar conductor 5.

Third Embodiment

Figure 19:
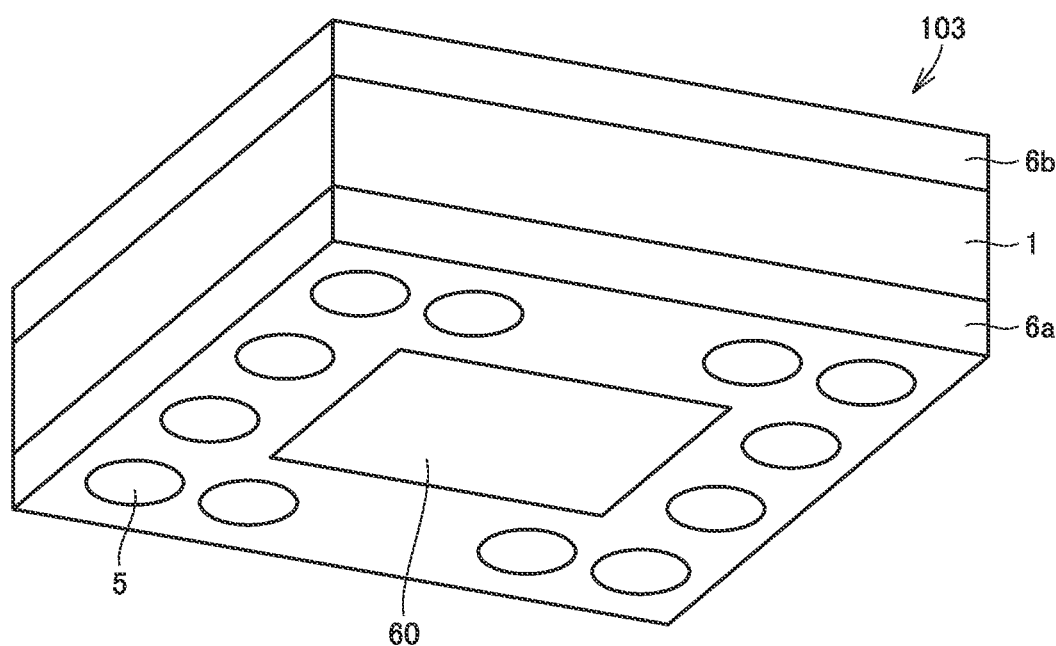
FIG. 19 is a perspective view of a structure body in a third embodiment based on the present disclosure.

A structure body in a third embodiment based on the present disclosure will be described with reference to FIGS. 19 to 22. FIG. 19 shows a perspective view of a structure body 103 in the present embodiment. In FIG. 19, a surface of structure body 103 on a side to be mounted on a mother substrate or the like is seen. This surface is referred to as a "lower surface" below. At the lower surface, sealing resin 6a is exposed. In a central portion of the lower surface, a semiconductor device 60 is exposed through sealing resin 6a. In an outer edge of the lower surface, a plurality of first columnar conductors 5 are exposed. The plurality of first columnar conductors 5 are aligned around the outer edge portion of the lower surface. This alignment is merely by way of example and the alignment is not necessarily as such.

At a side surface of structure body 103, ceramic substrate 1 is exposed. Insofar as the side surface of structure body 103 is seen, ceramic substrate 1 lies between sealing resin 6a and sealing resin 6b. This is merely by way of example and a construction is not necessarily as such. The side surface of structure body 103 may be covered with some kind of a film.

Figure 20:
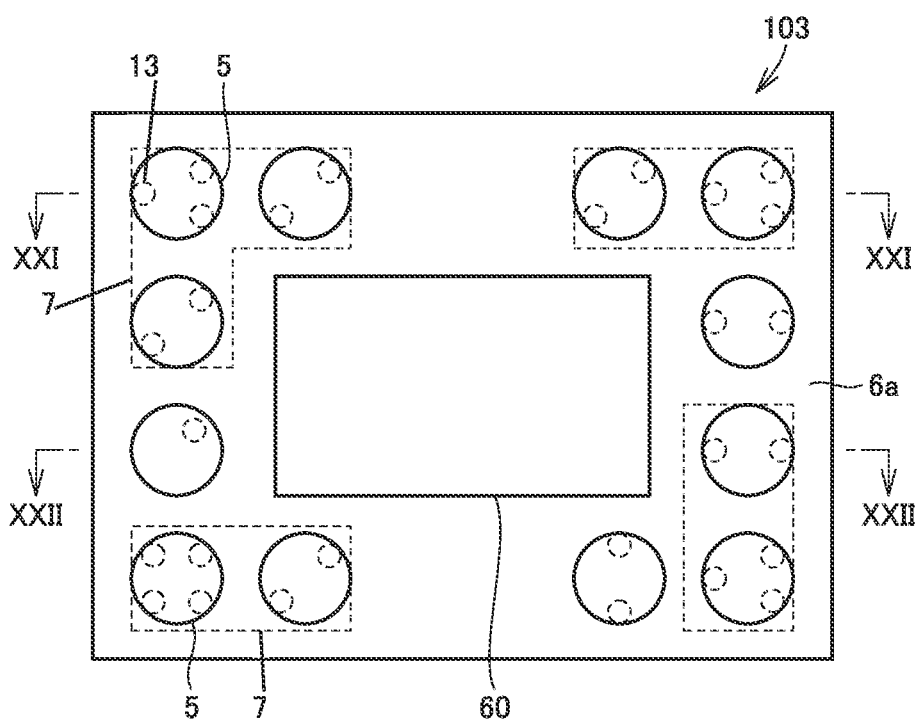
FIG. 20 is a bottom view of the structure body in the third embodiment based on the present disclosure.

FIG. 20 shows a bottom view of structure body 103. FIG. 20 shows with a dashed line, first conductor pattern 7 hidden behind sealing resin 6a. In structure body 103, there is also a portion where single first conductor pattern 7 is arranged in common to a plurality of first columnar conductors 5. In the example shown in FIG. 20, there is also a portion where a dashed line representing an outer geometry of first conductor pattern 7 does not surround the outer geometry of first columnar conductor 5. In such a portion, first conductor pattern 7 with the outer geometry exactly as large as the outer geometry of first columnar conductor 5 is superimposed behind first columnar conductor 5. In the example shown in FIG. 20, various numbers of conductor vias 13 are arranged for single first columnar conductor 5. There is a portion where only a single conductor via 13 is arranged for single first columnar conductor 5, whereas there is also a portion where four conductor vias 13 are arranged for single first columnar conductor 5. The number of conductor vias 13 to be arranged for single first columnar conductor 5 may thus be set as appropriate.

Figure 21:
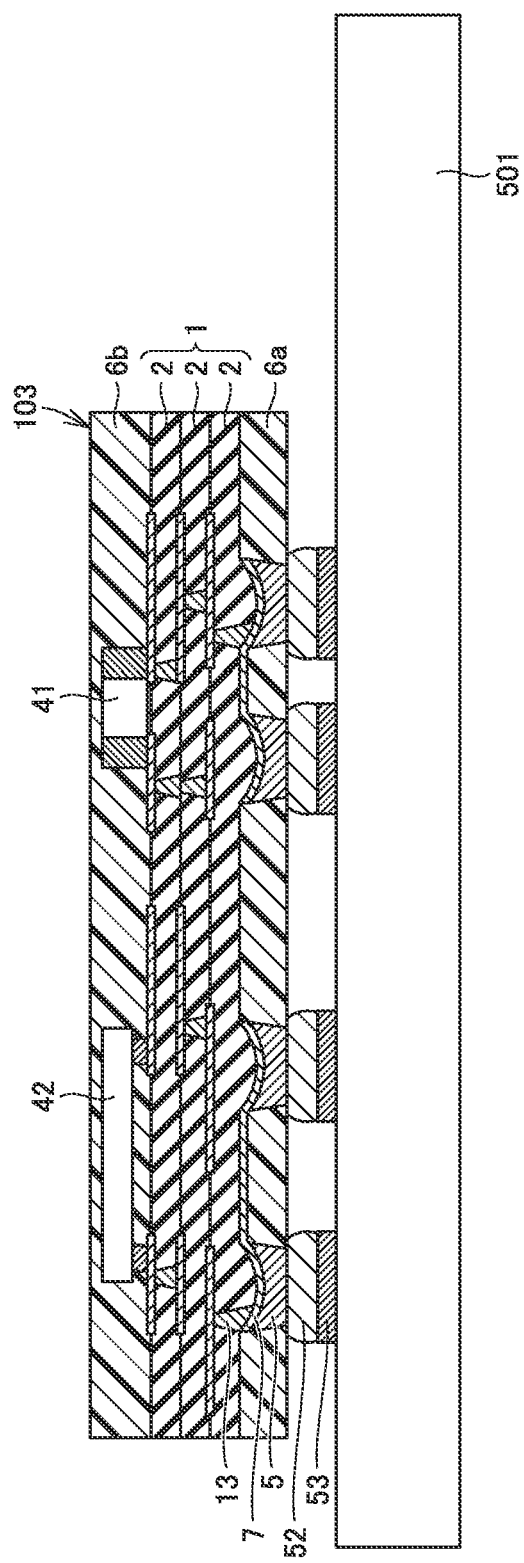
FIG. 21 is a cross-sectional view along the line XXI-XXI in FIG. 20.
Figure 22:
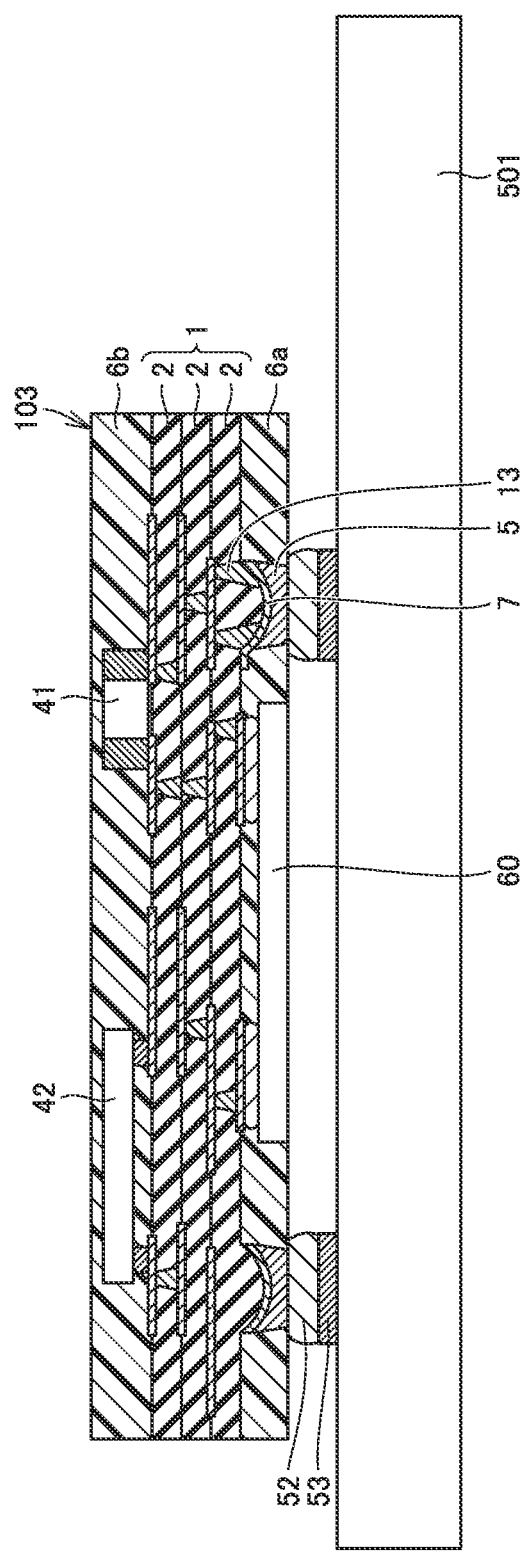
FIG. 22 is a cross-sectional view along the line XXII-XXII in FIG. 20.

FIGS. 21 and 22 each show a cross-sectional view when structure body 103 is mounted on a mother substrate 501. FIG. 21 is a cross-sectional view along the line XXI-XXI in FIG. 20. FIG. 22 is a cross-sectional view along the line XXII-XXII in FIG. 20. A pad electrode 53 is provided on a surface of mother substrate 501. The lower surface of first columnar conductor 5 is connected to pad electrode 53 of mother substrate 501 with a solder ball 52 being interposed.

The present embodiment can also obtain an effect as described in the second embodiment.

Fourth Embodiment

Figure 23:
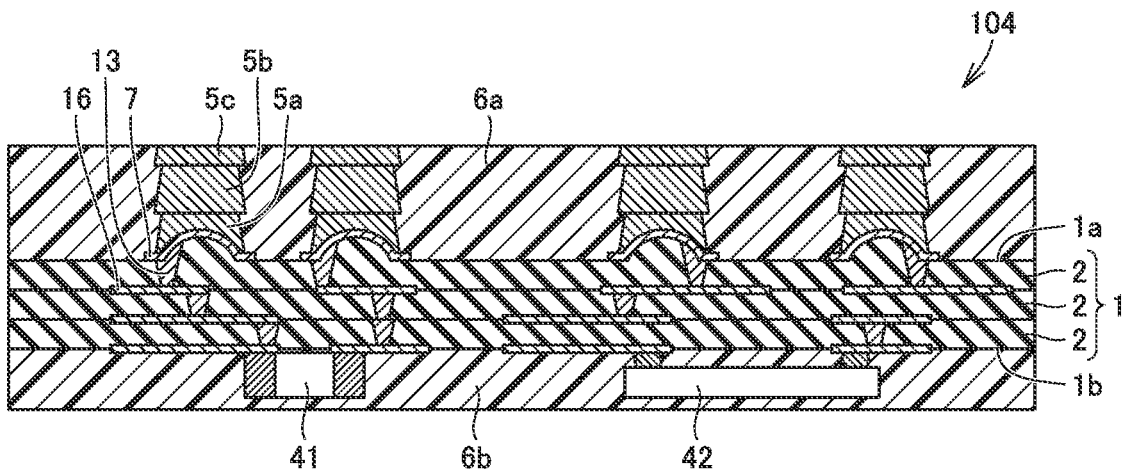
FIG. 23 is a cross-sectional view of a structure body in a fourth embodiment based on the present disclosure.
Figure 24:
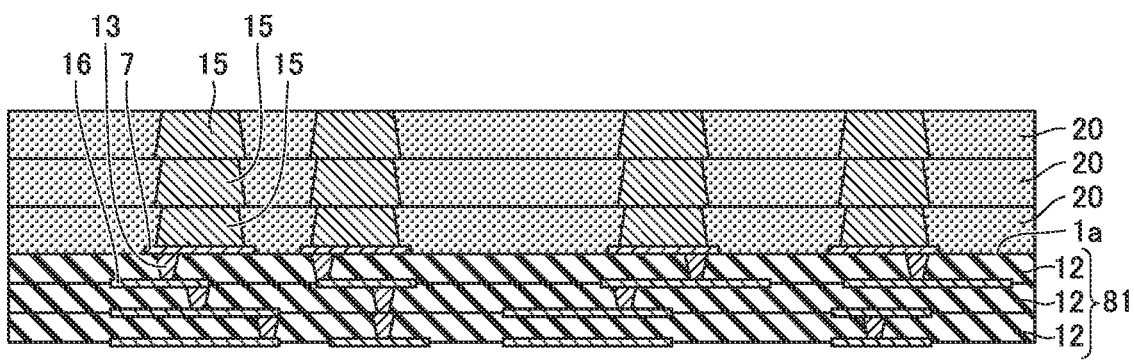
FIG. 24 is a first illustrative view of a method of manufacturing a structure body in the fourth embodiment based on the present disclosure.
Figure 25:
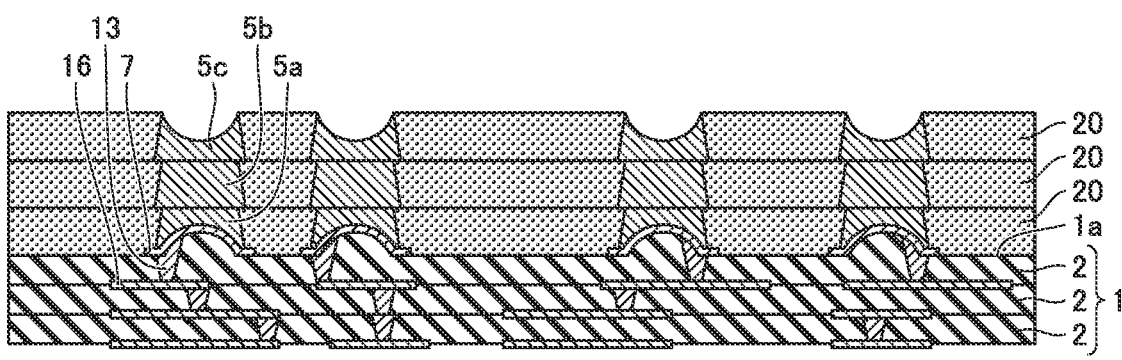
FIG. 25 is a second illustrative view of the method of manufacturing a structure body in the fourth embodiment based on the present disclosure.

A structure body in a fourth embodiment based on the present disclosure will be described with reference to FIGS. 23 to 25. FIG. 23 shows a cross-sectional view of a structure body 104 in the present embodiment. Structure body 104 is similar in basic construction to structure body 101 described in the first embodiment.

In the present embodiment, structure body 104 includes a second columnar conductor 5b. Second columnar conductor 5b is connected to an end of a first columnar conductor 5a on the side distant from ceramic substrate 1 and extends in the direction of thickness toward the side distant from ceramic substrate 1.

More specific description in line with an example shown in FIG. 23 will be given. In structure body 104, first columnar conductor 5a, second columnar conductor 5b, and a third columnar conductor 5c are arranged to pass through sealing resin 6a as being contiguous in the direction of thickness. Sealing resin 6a is larger in thickness than sealing resin 6a shown in the first embodiment. First columnar conductor 5a has a lower end connected to first conductor pattern 7 provided on first surface 1a. Third columnar conductor 5c has an upper end exposed to the outside through sealing resin 6a. Though an example in which three columnar conductors are contiguous in the direction of thickness is shown, the number of contiguous columnar conductors may be set to a number other than three, and may be set to two or four or more. Description will be given here assuming that the number of contiguous columnar conductors is set to three by way of example.

A method of manufacturing structure body 104 will be described with reference to FIGS. 24 to 25. Though this manufacturing method is similar to the manufacturing method described in the first embodiment, this manufacturing method uses a plurality of sacrificial sheets 20. As shown in FIG. 24, a plurality of sacrificial sheets 20 are layered on first surface 1a of first multilayer body 81 which is a multilayer body of ceramic green sheets 12. Lumps of conductive paste 15 filled in through hole 14 are thus contiguous in a vertical direction. As a result of firing in this state, a state shown in FIG. 25 is obtained. Since three lumps of conductive paste 15 contiguous in the vertical direction shrink as a result of firing, a recess is consequently provided in each of a lower surface of first columnar conductor 5a and an upper surface of third columnar conductor 5c. Since a total volume of conductive paste 15 is larger than in an example where only a single sacrificial sheet 20 is layered as shown in FIG. 7 in the first embodiment, a depth of the recess provided as a result of shrinkage is also larger.

The present embodiment can also obtain an effect as described in the first embodiment. Furthermore, in the present embodiment, structure body 104 includes second columnar conductor 5b, and second columnar conductor 5b is connected to the end of first columnar conductor 5a on the side distant from ceramic substrate 1 and extends in the direction of thickness toward the side distant from ceramic substrate 1. Therefore, the volume of the columnar conductor increases, and consequently the depth of the recess resulting from shrinkage during firing is larger and bonding strength can be increased.

As the number of columnar conductors contiguous in the direction of thickness increases, the total volume of conductive paste 15 increases and hence the depth of the recess resulting from shrinkage during firing increases.

Fifth Embodiment

Figure 26:
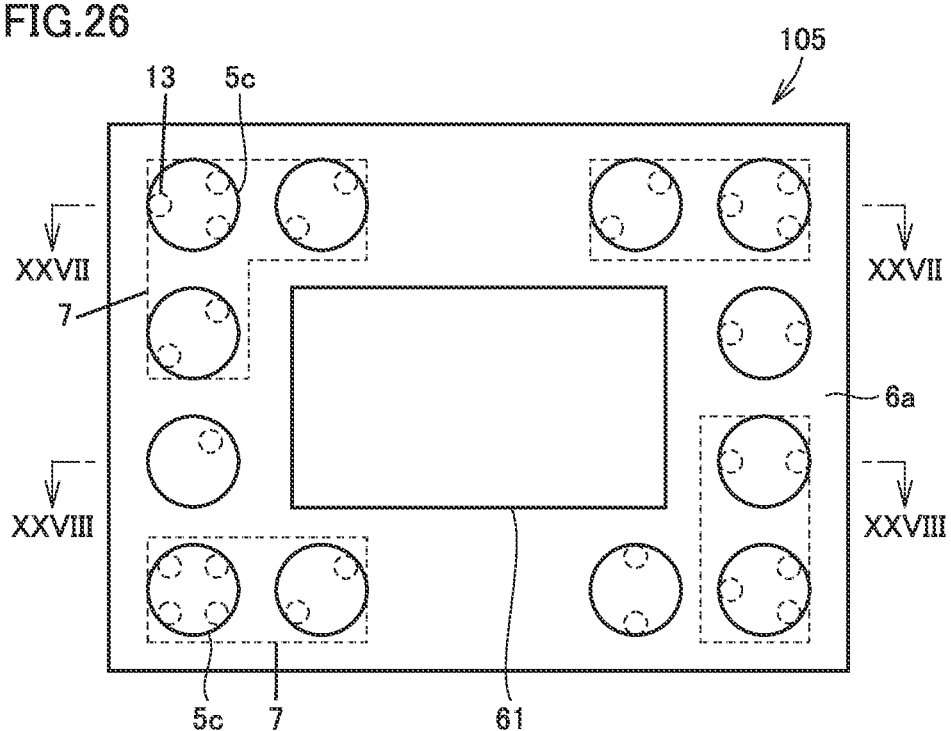
FIG. 26 is a bottom view of a structure body in a fifth embodiment based on the present disclosure.
Figure 27:
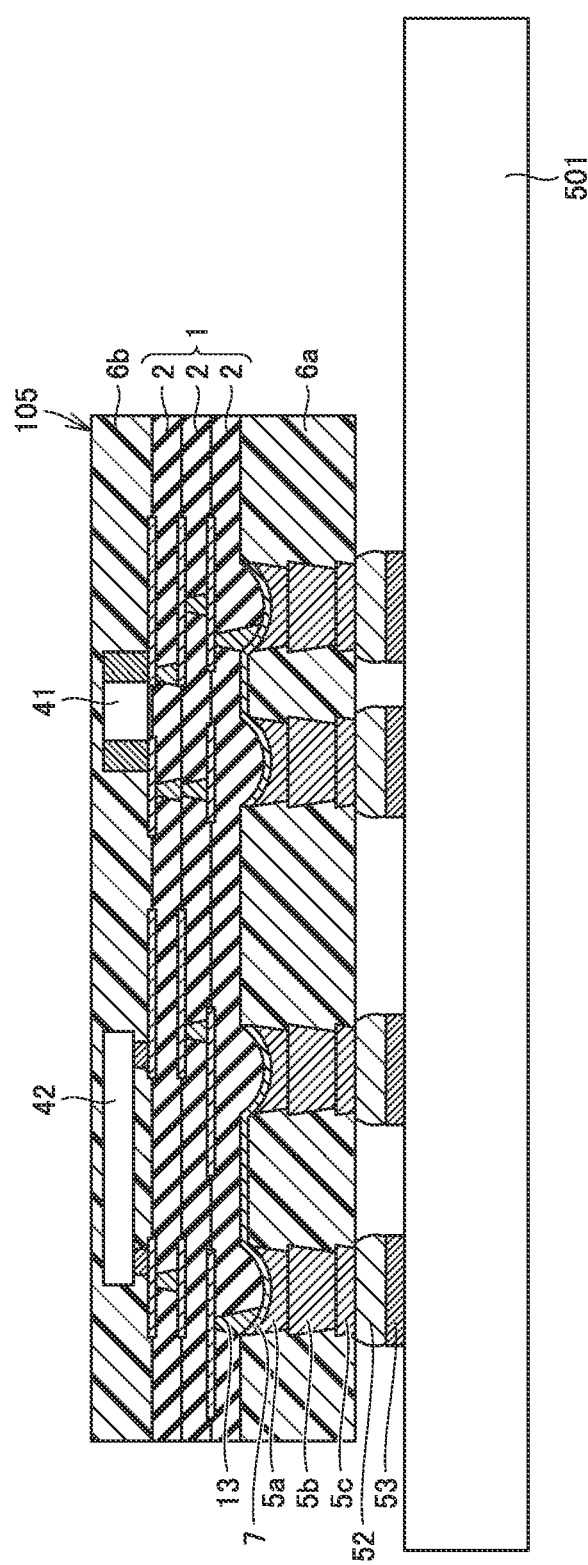
FIG. 27 is a cross-sectional view along the line XXVII-XXVII in FIG. 26.
Figure 28:
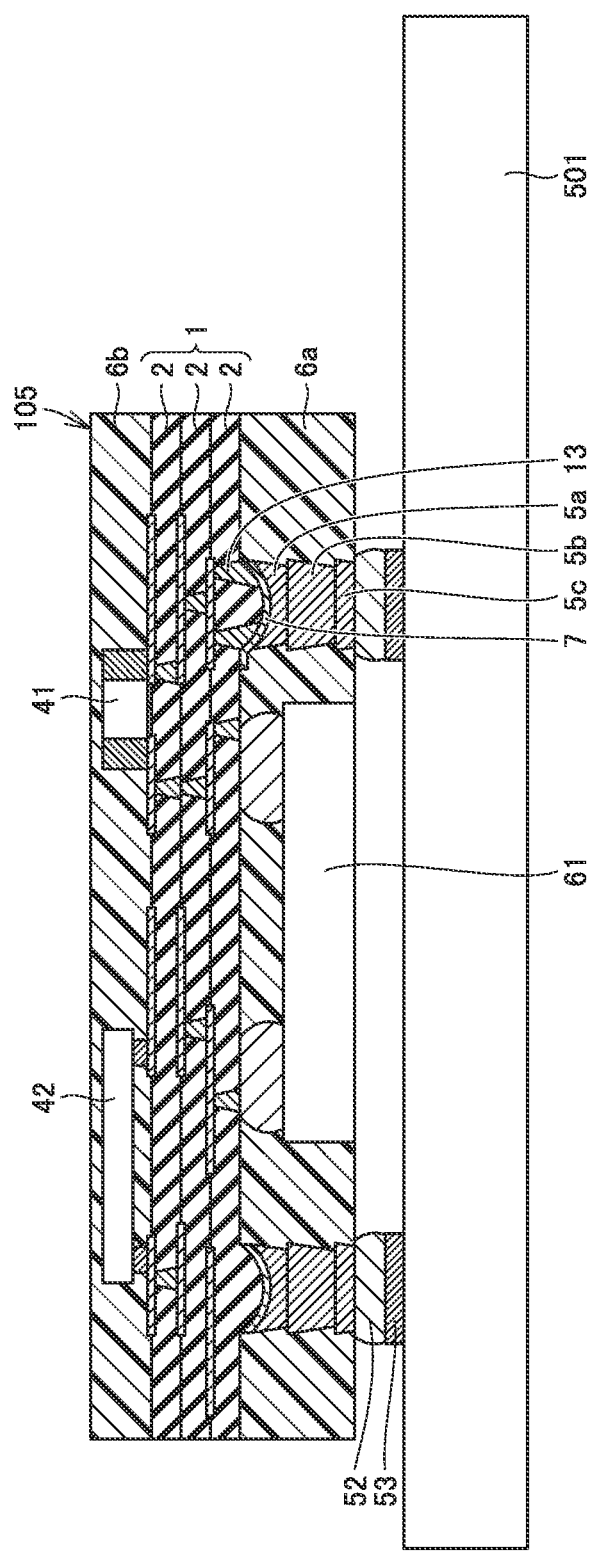
FIG. 28 is a cross-sectional view along the line XXVIII-XXVIII in FIG. 26.

A structure body in a fifth embodiment based on the present disclosure will be described with reference to FIGS. 26 to 28. FIG. 26 shows a bottom view of a structure body 105 in the present embodiment. In a central portion of a lower surface of structure body 105, a semiconductor device 61 is exposed through sealing resin 6a. Semiconductor device 61 is larger in thickness than semiconductor device 60 shown in the third embodiment. FIGS. 27 and 28 each show a cross-sectional view when structure body 105 is mounted on mother substrate 501. FIG. 27 is a cross-sectional view along the line XXVII-XXVII in FIG. 26. FIG. 28 is a cross-sectional view along the line XXVIII-XXVIII in FIG. 26. As shown in FIGS. 27 and 28, the lower surface of third columnar conductor 5c is connected to pad electrode 53 of mother substrate 501 with solder ball 52 being interposed.

The present embodiment can also obtain an effect as described in the fourth embodiment. Furthermore, in the present embodiment, the structure is such that columnar conductors are overlaid in tiers in the inside of sealing resin 6a. Therefore, sealing resin 6a can be larger in thickness and semiconductor device 61 with a large thickness can be accommodated as shown in FIG. 28.

With increase in height of the columnar conductor, force applied to the columnar conductor in the event of application of external force to the structure body from a lateral side also tends to be great, and high adhesion strength is required. In the present embodiment, with increase in height of the columnar conductor, the recess is larger, and consequently an area of bonding increases. Since strength of bonding of the columnar conductor to the ceramic substrate thus increases, adhesion strength against external force applied to the structure body can also be higher.

Sixth Embodiment

Figure 29:
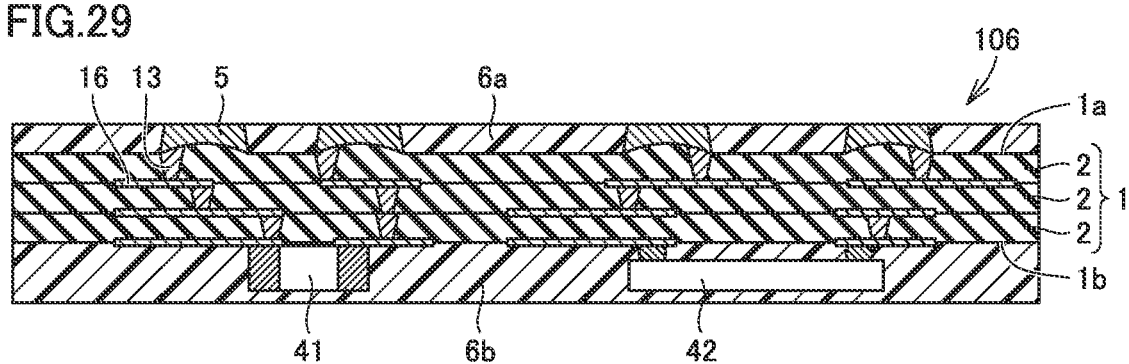
FIG. 29 is a cross-sectional view of a structure body in a sixth embodiment based on the present disclosure.
Figure 30:
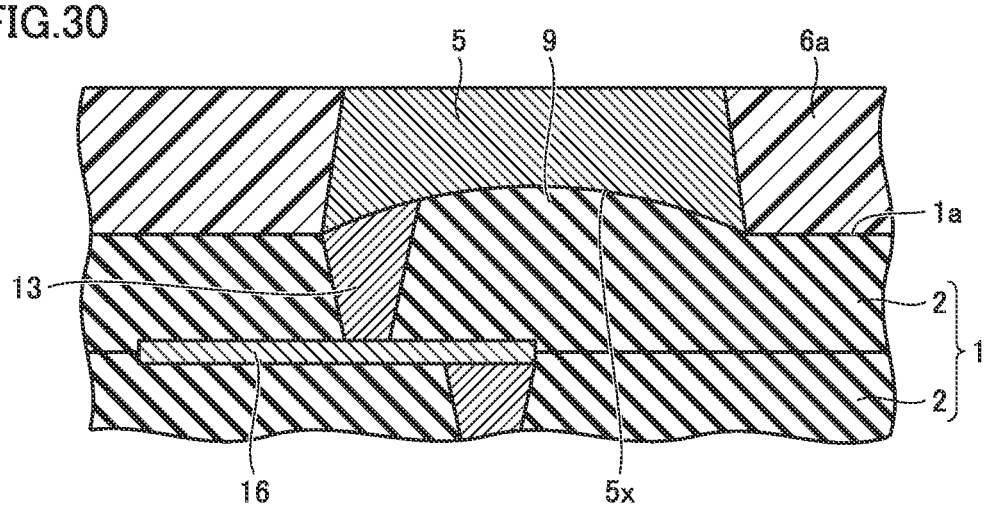
FIG. 30 is a partially enlarged view of FIG. 29.

A structure body in a sixth embodiment based on the present disclosure will be described with reference to FIG. 29. FIG. 29 shows a cross-sectional view of a structure body 106 in the present embodiment. Structure body 106 is similar in basic construction to structure body 101 described in the first embodiment. FIG. 30 shows first columnar conductor 5 and the vicinity thereof in FIG. 29 as being enlarged.

Structure body 106 in the present embodiment includes ceramic substrate 1 including first surface 1a and a first columnar conductor 5 connected to first surface 1a and extending in the direction of thickness in the orientation away from ceramic substrate 1. Ceramic substrate 1 includes conductor via 13 extending in the direction of thickness as being exposed at first surface 1a. First columnar conductor 5 is connected to conductor via 13. First columnar conductor 5 is provided with recess 5x in the end surface on the side close to ceramic substrate 1. First surface 1a is provided with raised portion 9 in conformity with recess 5x in the region where first columnar conductor 5 is superimposed.

Though structure body 106 is similar to structure body 101, they are different from each other in that first columnar conductor 5 has the lower end directly connected to conductor via 13 without first conductor pattern 7 being interposed.

Since first columnar conductor 5 is provided with recess 5x in the end surface on the side close to ceramic substrate 1 and first surface 1a is provided with raised portion 9 in conformity with recess 5x in the region where first columnar conductor 5 is superimposed also in the present embodiment, an area of bonding between first columnar conductor 5 and conductor via 13 is larger. Bonding strength between first columnar conductor 5 and ceramic substrate 1 is thus enhanced, and consequently reliability of the structure body improves.

Some features in embodiments above may be adopted as being combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first surface; 1b second surface; 2 insulating layer; 5, 5a first columnar conductor; 5b second columnar conductor; 5c third columnar conductor; 5x recess; 6a, 6b sealing resin; 7 first conductor pattern; 9 raised portion; 41, 42 component; 12 ceramic green sheet; 13 conductor via; 14 through hole; 15 conductive paste; 16 conductor pattern; 20 sacrificial sheet; 52 solder ball; 53 pad electrode; 60, 61 semiconductor device; 81 first multilayer body; 82 second multilayer body; 101, 102, 103, 104, 105, 106 structure body; 501 mother substrate

The invention claimed is:

1. A structure body comprising:
a ceramic substrate including a first surface;
a first conductor pattern arranged on the first surface; and
a first columnar conductor connected to the first conductor pattern and extending in a direction of thickness in an orientation away from the ceramic substrate, wherein
the first columnar conductor is provided with a recess in an end surface on a side closer to the ceramic substrate, and
the first surface is provided with a raised portion in conformity with the recess in a region where the first columnar conductor is superimposed.

2. The structure body according to claim 1, further comprising a conductor via connected to the first conductor pattern and extending in the direction of thickness in an orientation from the first surface toward inside of the ceramic substrate, wherein
when viewed two-dimensionally, the conductor via is arranged to at least partially be superimposed on the first columnar conductor at a position displaced from a center of the first columnar conductor.

3. The structure body according to claim 1, further comprising a plurality of conductor vias connected to the first conductor pattern and extending in the direction of thickness in an orientation from the first surface toward inside of the ceramic substrate, wherein
when viewed two-dimensionally, each of the plurality of conductor vias is arranged to at least partially be superimposed on the first columnar conductor at a position displaced from a center of the first columnar conductor.

4. The structure body according to claim 1, wherein
the first columnar conductor is in a tapered shape as decreasing in diameter as a distance from the first surface increases.

5. The structure body according to claim 1, wherein
the first columnar conductor is in a tapered shape as increasing in diameter as a distance from the first surface increases.

6. The structure body according to claim 1, further comprising a second columnar conductor connected to an end of the first columnar conductor on a side distant from the ceramic substrate and extending in the direction of thickness toward the side distant from the ceramic substrate.

7. The structure body according to claim 1, wherein
a shrinkage ratio during firing of a material for the first columnar conductor is higher than a shrinkage ratio during firing of a material for the ceramic substrate.

8. The structure body according to claim 2, wherein
the first columnar conductor is in a tapered shape as decreasing in diameter as a distance from the first surface increases.

9. The structure body according to claim 3, wherein
the first columnar conductor is in a tapered shape as decreasing in diameter as a distance from the first surface increases.

10. The structure body according to claim 2, wherein
the first columnar conductor is in a tapered shape as increasing in diameter as a distance from the first surface increases.

11. The structure body according to claim 3, wherein
the first columnar conductor is in a tapered shape as increasing in diameter as a distance from the first surface increases.

12. The structure body according to claim 2, further comprising a second columnar conductor connected to an end of the first columnar conductor on a side distant from the ceramic substrate and extending in the direction of thickness toward the side distant from the ceramic substrate.

13. The structure body according to claim 3, further comprising a second columnar conductor connected to an end of the first columnar conductor on a side distant from the ceramic substrate and extending in the direction of thickness toward the side distant from the ceramic substrate.

14. The structure body according to claim 4, further comprising a second columnar conductor connected to an end of the first columnar conductor on a side distant from the ceramic substrate and extending in the direction of thickness toward the side distant from the ceramic substrate.

15. A structure body comprising:
a ceramic substrate including a first surface; and
a first columnar conductor connected to the first surface and extending in a direction of thickness in an orientation away from the ceramic substrate, wherein
the ceramic substrate includes a conductor via extending in a direction of thickness as being exposed at the first surface,
the first columnar conductor is connected to the conductor via,
the first columnar conductor is provided with a recess in an end surface on a side closer to the ceramic substrate, and
the first surface is provided with a raised portion in conformity with the recess in a region where the first columnar conductor is superimposed.

16. The structure body according to claim 15 wherein
the first columnar conductor is in a tapered shape as decreasing in diameter as a distance from the first surface increases.

17. The structure body according to claim 15, wherein
the first columnar conductor is in a tapered shape as increasing in diameter as a distance from the first surface increases.

18. The structure body according to claim 15, further comprising a second columnar conductor connected to an end of the first columnar conductor on a side distant from the ceramic substrate and extending in the direction of thickness toward the side distant from the ceramic substrate.

19. A method of manufacturing a structure body, the method comprising:
providing a through hole in a sacrificial sheet not sintered in a temperature range where a ceramic component of a ceramic green sheet is sintered;
filling the through hole with a conductive paste;
preparing a first multilayer body being a multilayer body of ceramic green sheets, the first multilayer body including a first surface;
obtaining a second multilayer body by layering the sacrificial sheet on the first surface of the first multilayer body;
firing the second multilayer body; and
removing the sacrificial sheet from the second multilayer body to leave a first columnar conductor generated by firing of the conductive paste, wherein
after the firing of the second multilayer body, the first columnar conductor is provided with a recess in an end surface on a side closer to a ceramic substrate formed by firing of the first multilayer body, and
the first surface is provided with a raised portion in conformity with the recess in a region where the first columnar conductor is superimposed.

20. The method of manufacturing a structure body according to claim 19, wherein
a shrinkage ratio during firing of the conductive paste is higher than a shrinkage ratio during firing of the ceramic green sheet.

* * * * *